United States Patent
Hahn et al.

(10) Patent No.: US 10,700,496 B2
(45) Date of Patent: *Jun. 30, 2020

(54) ELECTRO-OPTICAL DEVICE WITH LATERAL ELECTRON BLOCKING LAYER

(71) Applicant: International Business Machines Corporation, Armonk, NY (US)

(72) Inventors: Herwig Hahn, Adliswil (CH); Charles Caër, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/429,603

(22) Filed: Jun. 3, 2019

(65) Prior Publication Data

US 2019/0288486 A1    Sep. 19, 2019

Related U.S. Application Data

(63) Continuation of application No. 15/806,684, filed on Nov. 8, 2017, now Pat. No. 10,355,453.

(51) Int. Cl.
*H01S 5/042* (2006.01)
*H01S 5/22* (2006.01)
(Continued)

(52) U.S. Cl.
CPC ............ *H01S 5/221* (2013.01); *H01S 5/0228* (2013.01); *H01S 5/02236* (2013.01);
(Continued)

(58) Field of Classification Search
CPC .... H01S 5/0424; H01S 5/2205; H01S 5/2206; H01S 5/221; H01S 5/2275
See application file for complete search history.

(56) References Cited

U.S. PATENT DOCUMENTS

| | | | |
|---|---|---|---|
| 4,644,553 A | 2/1987 | Van Ruyven et al. | |
| 5,563,902 A | 10/1996 | Xu et al. | |

(Continued)

FOREIGN PATENT DOCUMENTS

| | | |
|---|---|---|
| CN | 101017959 B | 9/2011 |
| EP | 1328050 B1 | 3/2011 |
| WO | 2016087888 A1 | 6/2016 |

OTHER PUBLICATIONS

Goharrizi et al., "The influence of quaternary electron blocking layer on the performance characteristics of intracavity-contacted oxide-confined InGaN-based vertical cavity surface emitting lasers," http://www.worldscientific.com/doi/abs/10.1142/S0217979215502306?journalCode=ijmpb, International Journal of Modern Physics B vol. 29, No. 31 (2015) 1550230 (14 pages), ©World Scientific Publishing Company.

(Continued)

Primary Examiner — Michael Carter
(74) Attorney, Agent, or Firm — Peter J. Edwards

(57) ABSTRACT

A device may include a substrate and an active region. This active region may include a stack of semiconductor gain materials stacked along a stacking direction. The latter may extend substantially perpendicular to a plane of the substrate. The active region may be furthermore tapered so as to widen toward the substrate. In addition, the device may include a pair of doped layers semiconductor materials, the pair may include an n-doped layer and a p-doped layer arranged on the substrate and on opposite. The doped layers may be arranged on the substrate and on opposite, lateral sides of the tapered active region, respectively. The device may include an electron blocking layer, which may extend both at a first interface, between a p-doped layer and the substrate, and at a second interface, between the tapered (Continued)

active region and the p-doped layer, along a lateral side of the tapered active region.

20 Claims, 6 Drawing Sheets

(51) Int. Cl.
| | | |
|---|---|---|
| *H01S 5/30* | (2006.01) | |
| *H01S 5/343* | (2006.01) | |
| *H01S 5/022* | (2006.01) | |
| *H01S 5/20* | (2006.01) | |
| *H01S 5/02* | (2006.01) | |
| *H01S 5/026* | (2006.01) | |
| *H01S 5/32* | (2006.01) | |
| *H01S 5/10* | (2006.01) | |

(52) U.S. Cl.
CPC .......... *H01S 5/0421* (2013.01); *H01S 5/0424* (2013.01); *H01S 5/2009* (2013.01); *H01S 5/3054* (2013.01); *H01S 5/343* (2013.01); *H01S 5/021* (2013.01); *H01S 5/0215* (2013.01); *H01S 5/0261* (2013.01); *H01S 5/0425* (2013.01); *H01S 5/1032* (2013.01); *H01S 5/3211* (2013.01); *H01S 5/34366* (2013.01); *H01S 2304/00* (2013.01)

(56) References Cited

U.S. PATENT DOCUMENTS

| | | |
|---|---|---|
| 5,956,358 A | 9/1999 | Sasaki |
| 7,653,106 B2 | 1/2010 | Arimoto |
| 7,804,869 B2 | 9/2010 | Freund |
| 9,054,498 B2 | 6/2015 | Cohen et al. |
| 9,059,356 B1 | 6/2015 | Miller et al. |
| 10,355,453 B2 * | 7/2019 | Hahn .................... H01S 5/0228 |
| 2007/0057249 A1 | 3/2007 | Kim et al. |
| 2019/0140425 A1 | 5/2019 | Hahn et al. |

OTHER PUBLICATIONS

Okumura et al., "Lateral current injection GaInAsP/InP laser on semi-insulating substrate for membrane-based photonic circuits," Optics Expr., vol. 17, No. 15, pp. 12564-12570, 2009.

Ahn et al., "A field effect quantum well laser with lateral current injection," Journal of Applied Physics 64, 440 (1988); doi: 10.1063/1.341214, 4 pgs.

Matsuo et al., "Photonic crystal lasers using wavelength-scale embedded active region," J. Phys. D: Appl. Phys. 47 (2014) 023001, 19 pgs., © 2014 IOP Publishing, Ltd.

Suda et al., "An Investigation of Lateral Current Injection Laser Internal Operation Mechanisms," IEEE Photonics Technology Letters, vol. 7, No. 10, Oct. 1995, pp. 1122-1124.

Sargent et al., "Lateral Current Injection Lasers: Underlying Mechanisms and Design for Improved High-Power Efficiency," Journal of Lightwave Technology, vol. 16, No. 10, pp. 1854-1864, Oct. 1998.

Hahn et al., "Electro-Optical Device With Lateral Electron Blocking Layer," U.S. Appl. No. 15/806,684, filed Nov. 8, 2017.

List of IBM Patents or Patent Applications Treated as Related, Dated Jun. 2, 2019, 2 pages.

* cited by examiner

ELECTRO-OPTICAL DEVICE WITH LATERAL ELECTRON BLOCKING LAYER

BACKGROUND

Embodiments of the present disclosure relate, in general, to the field of electro-optical devices with a lateral current injection, as well as silicon photonics chips comprising such devices and a method of fabricating an electro-optical device. Such an electro-optical device may notably comprise optoelectronic devices such as laser devices, optical detectors, and semiconductor optical amplifiers. In particular, embodiments of the present disclosure concern an electro-optical device having an electron blocking layer extending laterally to an active region of the device.

SUMMARY

Embodiments of the present disclosure include a lateral current injection electro-optical device. The lateral current injection electro-optical device includes a substrate, an active region on the substrate. The active region may include a stack of III-V semiconductor gain materials that are stacked along a stacking direction that extends substantially perpendicular to the plane of the substrate. The active region may be tapered so as to widen toward the substrate. The lateral current injection electro-optical device may include a pair of doped layers of III-V semiconductor materials. The pair may include an n-doped layer and a p-doped layer arranged on the substrate and on opposite, lateral sides of the tapered active region, respectively. The lateral current injection electro-optical may further include an electron blocking layer that may extend both at a first interface between the p-doped layer and the substrate and a second interface between the tapered active region and the p-doped layer.

Embodiments of the present disclosure include a silicon photonics chip. The silicon photonics chip includes a substrate, an active region on the substrate. The active region may include a stack of III-V semiconductor gain materials that are stacked along a stacking direction that extends substantially perpendicular to an average plane of the substrate. The active region may be tapered so as to widen toward the substrate. The silicon photonics chip may include a pair of doped layers of III-V semiconductor materials. The pair may include an n-doped layer and a p-doped layer arranged on the substrate and on opposite, lateral sides of the tapered active region, respectively. The silicon photonics chip may further include an electron blocking layer that may extend both at a first interface between the p-doped layer and the substrate and a second interface between the tapered active region and the p-doped layer. The silicon photonics chip may further include one or more silicon waveguide cores that may be configured to couple optical radiation out-coupled from the active region of the silicon photonics chip to couple into the one or more silicon waveguide cores, in operation.

Embodiments of the present disclosure include a method of fabrication of an electro-optical device. The method may include providing a substrate. The method may include growing an active region on the substrate provided. The active region may include a stack of III-V semiconductor gain materials stacked along a stacking direction z extending perpendicular to an average plane of the substrate. The method may further include etching the grown active region such that the active region is tapered. A portion of the active region closest to the substrate is wider that a portion of the active region opposite the substrate. The method may include selectively re-growing a pair of doped layers of III-V semiconductor materials to obtain an n-doped layer and a p-doped layer arranged on the substrate and on opposite, lateral sides of the tapered active region, respectively. The electron blocking layer may be deposited such that the electron blocking layer extends at a first interface between the p-doped layer and the substrate and a second interface between the tapered active region and the p-doped layer. The electron blocking layer may be deposited prior to re-growing the p-doped layer.

Figure 1A:
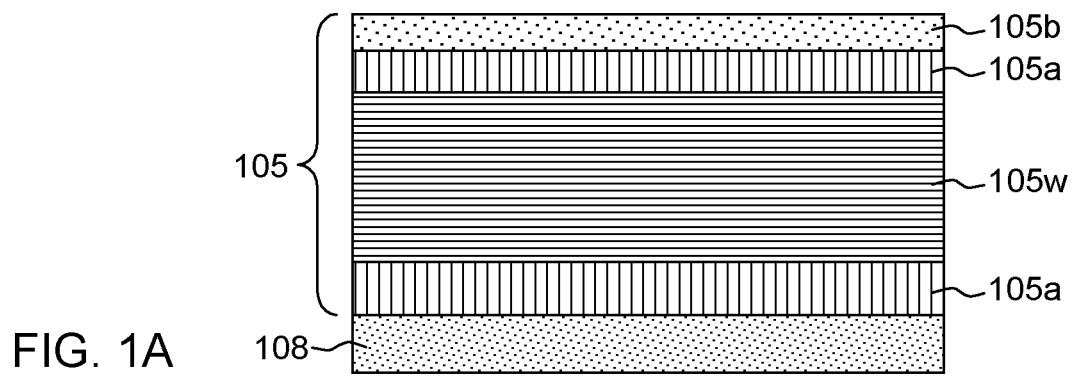
FIG. 1A illustrates a 2D cross-sectional view of a high-level fabrication step of a lateral current injection (LCI), electro-optical device comprising a plurality of layers, according to embodiments of the present disclosure.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

For monolithic integration of III-V electro-optical devices on silicon (Si) complimentary metal-oxide-semiconductor (CMOS) platforms, shallow stacks of layers of III-V semiconductor compounds may be necessary, which typically needs be less than 500 nm thick. In such shallow stacks, each individual layer must be very thin. As it may be realized, this may lead to increased series resistances in the III-V stack. This is true for the p-type side of the device. Due to a low hole mobility in the III-V contact materials (such as, Indium Phosphide (InP)—the hole mobility may be roughly ten times lower than the electrons at the same doping concentration), a high sheet resistance and hence a low hole injection efficiency into a multi quantum well prevents the device from reaching very good performances. Hence, as one understands, there is a need to improve the hole injection efficiency in such devices.

Furthermore, due to the need of low-power devices, the dimensions of the active regions (e.g., comprising a multiple quantum well section) become smaller and smaller. This too impacts hole injection.

As known, hole injection can generally be improved by using lateral current injection (LCI) lasers. LCI lasers allow lower threshold current compared to vertical injection devices. However, LCI devices typically suffer from parasitic leakage currents, which impairs the efficiency of the devices.

Aspects of the present disclosure may include a lateral current injection (LCI), electro-optical device. The device may comprise a substrate and an active region, which may be arranged on the substrate. This active region may comprise a stack of III-V semiconductor gain materials stacked along a stacking direction z that may be substantially normal to a surface of the substrate. The latter may extend substantially perpendicular to an average plane of the substrate. The active region may be furthermore tapered so as to widen toward the substrate. In addition, the device may include a pair of doped layers of III-V semiconductor materials, i.e., an n-doped layer and a p-doped layer. The doped layers may be arranged on the substrate and on opposite, lateral sides of the tapered active region, respectively. Finally, the device may comprise an electron blocking layer (EBL), which extends both at a first interface, between the p-doped layer and the substrate, and at a second interface, between the tapered active region and the p-doped layer (e.g., along a lateral side of the tapered active region).

The tapered section of the active region makes it possible to deposit the EBL from the top. Indeed, the lateral sides of the active region are apparent from the top, thanks to the flared profile of the active region, which makes it possible for particles to "hook" on the lateral sides when being deposited. More precisely, the EBL can be deposited so as for it to have both a lateral portion, which extends laterally to the active region and is transverse to the substrate, and a parallel portion, which is parallel to the substrate. The EBL advantageously prevents electron leakage from the n-side of the active region to the p-side. At least, it makes it possible to lower such leakage currents, which henceforth allows a higher output power to be achieved.

In embodiments, the electro-optical device may include one or more of the following (optional) features: the angle of the tapered section of the active region can be optimized for fabrication purposes (starting with the EBL deposition). In particular, the active region may be tapered so as for the lateral side of the tapered active region on which the EBL extends to deviate from the stacking direction z by an angle α that is between 5° and 70°, with some embodiments deviating by an angle between 10° and 30°. In some embodiments, the EBL has an average thickness that is between 5 nm and 100 nm, with particular embodiments having an average thickness between 10 nm and 50 nm. In general, a 5 or 10 nm thick layer will be necessary to prevent electron tunneling between the active region and the p-doped contact layer. On the other hand, the EBL will typically not need to be thicker than 100 nm.

In some embodiments, the EBL comprises a InAlAs lattice-matched to the substrate. Using InAlAs for the EBL allows more adequate properties (in terms of conduction band offset) to be obtained, as compared with other III-V materials, as the Inventors observed. The device may further comprise a first ohmic contact and a second ohmic contact respectively formed on the n-doped layer and the p-doped layer, opposite to the substrate, and a gap is provided in a direction parallel to the stacking direction z, between the second ohmic contact and the EBL. This way, the EBL is not in direct contact with the second ohmic contact, so as to avoid or mitigate electron leakage through the ohmic contact. The second ohmic contact includes an ohmic contact layer that comprises a doped III-V semiconductor compound, and said gap is provided between the EBL and said ohmic contact layer.

The electro-optical device may further comprise an etch mask layer on top of said stack, opposite the substrate, and the gap between the EBL and the ohmic contact layer may be at least partly provided by a lateral side portion of the etch mask layer. Said stack may comprise a multiple quantum well section sandwiched between separate confinement heterostructure layers, as well as a residual seed layer between said etch mask layer and one of the separate confinement heterostructure layers, opposite the substrate with respect to the multiple quantum well section (MQW), and the EBL may extend beyond the residual seed layer, up to said etch mask layer. In embodiments, the EBL has a positive conduction band offset, in energy, with respect to a conduction band of the III-V stack, the offset corresponding to an energy offset that an electron needs to overcome in order to pass from the III-V stack to the EBL, when travelling toward the p-doped layer in an average direction that is perpendicular to the stacking direction z. The EBL may also have a negative valence band offset, in energy, with respect to a valence band of the III-V stack. In some embodiments, the electro-optical device is a lateral current injection (LCI) laser device, and the stack of III-V semiconductor gain materials comprises one of: $In_{1-x-y}Al_xGa_yAs$; $In_{1-x}Ga_xAs_yP_{1-y}$; and $In_{1-x}Ga_{x-}As_yN_{1-y}$, with $0 \leq x \leq 1$ and $0 \leq y \leq 1-x$, and each of the p-doped layer and the n-doped layer comprises one of InP, InAs or GaAs.

Another aspect of the present disclosure includes a silicon photonics chip. The silicon photonics chip comprises an LCI, electro-optical device according to embodiments such as those described above. In some embodiments, this chip includes one or more silicon waveguide cores, configured so as for optical radiation out-coupled from the active region of the electro-optical device to couple into the one or more silicon waveguide cores, in operation.

In some embodiments, the silicon photonics chip further comprises a silicon on insulator wafer, whose top silicon layer is structured so as to form said one or more silicon waveguide cores. In some embodiments, the silicon photonics chip is a CMOS-fabricated device, which further comprises CMOS-compatible metal contacts patterned on top of the n-doped layer and the p-doped layer, opposite said substrate.

In embodiments, the electro-optical device is embedded in a back end of the line of the silicon photonics chip. In some embodiments, the electro-optical device is co-integrated in the back end of the line of the silicon photonics chip, with one or more CMOS-fabricated integrated circuits that are configured in the chip for driving said electro-optical device.

Further aspects of the present disclosure include a method of fabrication of an electro-optical device. The method relies on growing an active region, on a provided substrate, so as for the active region to comprise a stack of III-V semiconductor gain materials, the latter stacked along a stacking direction z extending perpendicular to an average plane of the substrate. According to the method, the active region is further etched for it to be tapered so as to widen toward the substrate. Additionally, a pair of doped layers of III-V semiconductor materials are selectively re-grown to obtain an n-doped layer and a p-doped layer arranged on the substrate and on opposite, lateral sides of the tapered active region, respectively. An EBL is deposited prior to re-growing the p-doped layer so as for the EBL to extend both at a first interface between the p-doped layer and the substrate and a second interface between the tapered active region and the p-doped layer, consistent with the devices described above.

Devices and fabrication methods according to embodiments of the present disclosure will now be described, by way of non-limiting examples, and in reference to the accompanying drawings.

In lateral current injection (LCI) devices, electron leakage from the n-side to the p-side of the device happens to limit an amount of output power. This electron leakage can be solved by including a lateral electron blocking layer (EBL). One difficulty, however, is to be able to grow such a lateral blocking layer in a LCI device, where an active region is horizontally arranged between lateral contact layers. As described herein, this can nevertheless be achieved by including a tapered active region (e.g., a flared region, as in a truncated cone or pyramid). Eventually, a suitably arranged EBL allows higher output power to be achieved in the resulting LCI devices, as discussed in the following.

FIGS. 1A-1F describe embodiments of the present disclosure that relate to a method of fabrication of an, e.g., electro-optical device or an Si chip. Turning to FIG. 1A, a plurality of layers forming a stack of semiconductor materials collectively referred to as the active region 105 comprises a stack of III-V semiconductor gain materials: a first layer 105a, a second layer 105w, a third layer 105a, and a fourth layer 105b. The active region may be upon a substrate 108 can be seen, according to embodiments of the present disclosure. The method may first include growing an active region 105 on the substrate 108. The substrate 108 and/or the fourth layer 105b may be, e.g., indium phosphide—an insulating material that may be positively or negatively doped—or the like. The first layer 105a and/or the third layer 105a may be, e.g., a separate confinement heterostructure (SCH) material. The second layer 105w may be, e.g., multiple quantum wells (MQWs) that were, e.g., grown on a lower level (e.g., first layer 105a). The III-V semiconductor gain materials may be stacked along a stacking direction that is substantially perpendicular to the average plane of the substrate 108.

Figure 1B:
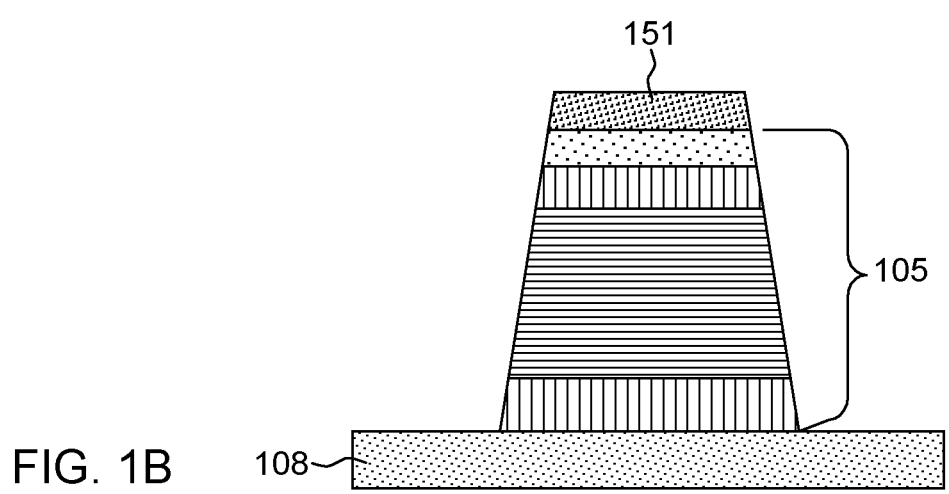
FIG. 1B illustrates a 2D cross-sectional view of a high-level fabrication step of the LCI that additionally includes an etch mask, according to embodiments of the present disclosure.

Now turning to FIG. 1B, the active region 105 may be etched utilizing an active suitable mask, so as to widen as the portions of the active region 105 are proximate towards the substrate 108. To that aim, an etch mask 151 is typically applied on top of the stack 105, prior to etching. The etch mask may be applied utilizing reactive ion etching. A residual portion of the etch mask 151 can thus typically be seen in embodiments of the present disclosure.

Figure 1C:
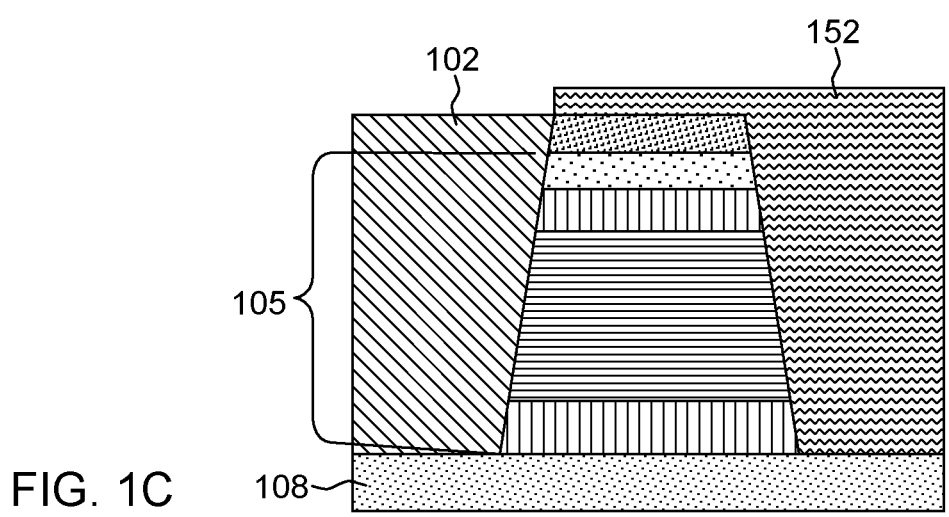
FIG. 1C illustrates a 2D cross-sectional view of a high-level fabrication step of the LCI that additionally includes an n-doped layer and a first regrowth mask, according to embodiments of the present disclosure.

Turning now to FIG. 1C, a doped layer 102 that comprises a negatively doped (n-doped) layer of indium phosphide and/or III-V semiconductor materials may be selectively re-grown. An aim is to obtain an n-doped layer 102 that may be arranged on an opposite, lateral side of the active region 105. To that aim, regrowth mask 152 may be applied, as is commonly known in the art of re-growth techniques.

Figure 1D:
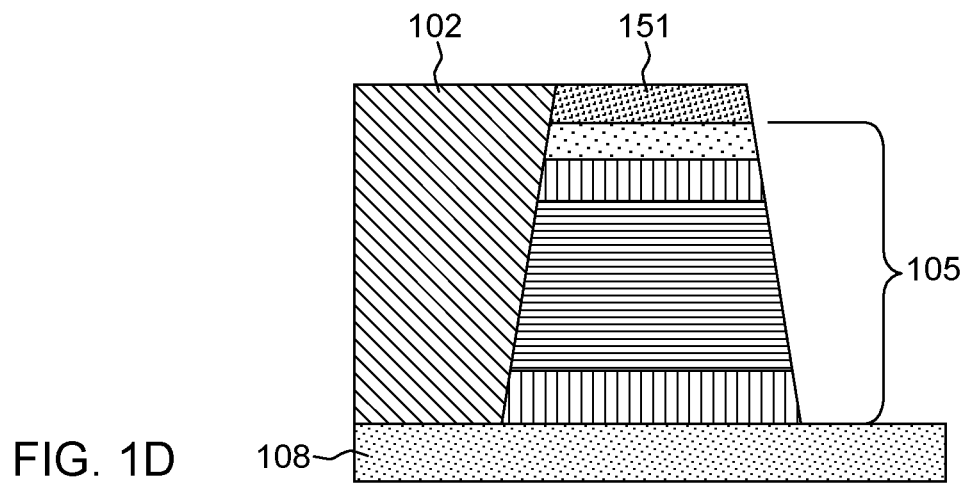
FIG. 1D illustrates a 2D cross-sectional view of a high-level fabrication step of the LCI with the first regrowth mask removed, according to embodiments of the present disclosure.

Turning now to FIG. 1D, the substrate 108, the n-doped later 102, and the active region 105 can be seen, according to various embodiments. In some embodiments, the regrowth mask 152 may have been removed by applying various chemical etching techniques that are commonly known in the art.

Figure 1E:
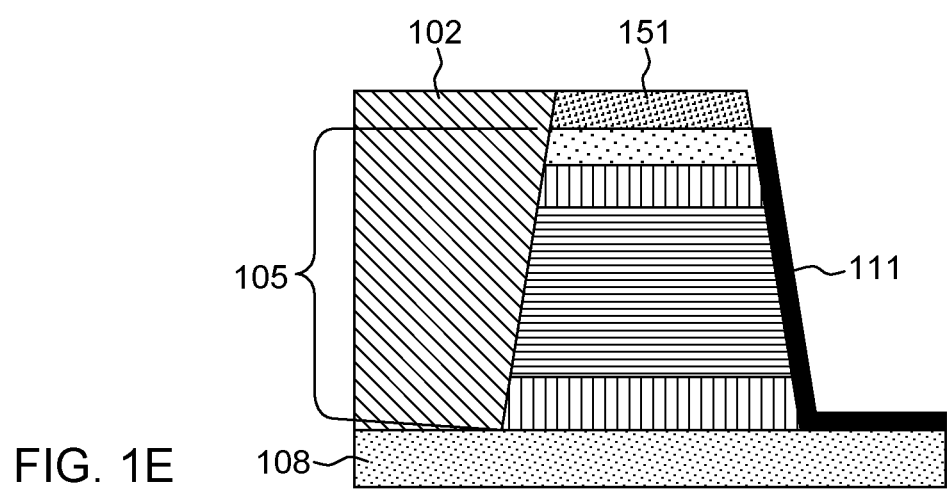
FIG. 1E illustrates a 2D cross-sectional view of a high-level fabrication step of the LCI that additionally includes an electron blocking layer, according to embodiments of the present disclosure.

Now turning to FIG. 1E, an electron beam lithography (EBL) 111 application of, e.g., aluminum indium arsenide may be deposited on a sidewall and a top portion of the active region 105 and the substrate 108, respectively. The EBL 111 may also partially cover a portion of a side of the etch mask 151. This can be achieved in part due to a tapered profile of the active region 105, which makes it possible for the EBL 111 to be deposited from the top and bond to the lateral flanks. This may be accomplished prior to re-growing a p-doped layer 104, as will be discussed with reference to FIG. 1F.

Figure 1F:
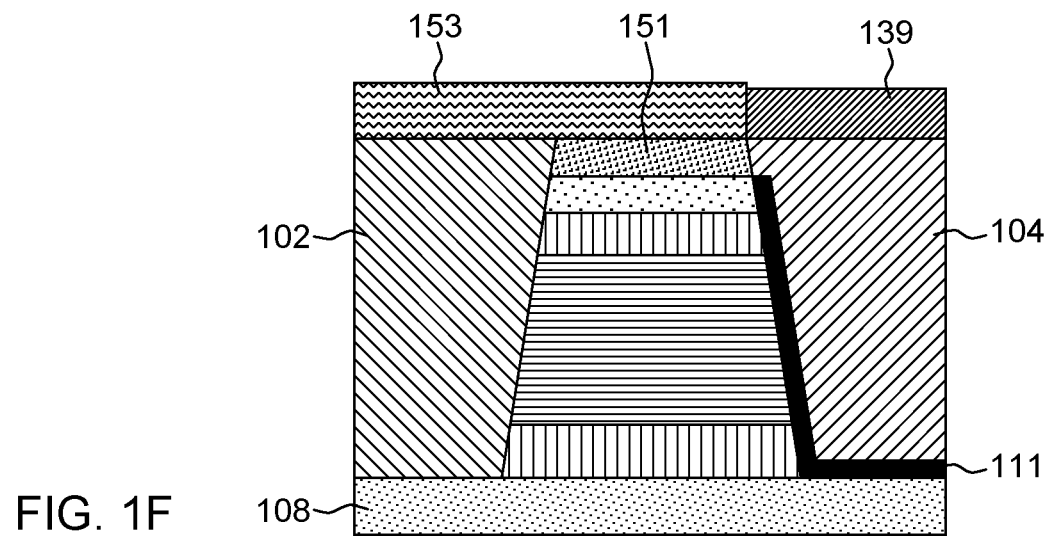
FIG. 1F illustrates a 2D cross-sectional view of a high-level fabrication step of the LCI that additionally includes a p-doped layer, a second regrowth mask, and an ohmic layer, according to embodiments of the present disclosure.

Now turning to FIG. 1F, a re-grown p-doped layer 104 that is in part covering the EBL 111 and the etch mask 151 is illustrated. Eventually, the EBL 111 may extend both at an interface between the p-doped layer 104 and the substrate 108 and at the interface between a tapered portion of the active region 105 and the p-doped layer 104. The EBL extends laterally and as necessary to separate the III-V materials of the active region 105 from the p-doped contact layer 104.

Additionally, a gap may be provided between a top portion of the EBL 111 and an opposite ohmic contact layer 139, as illustrated in FIG. 1F. Residual portions of the etch mask layer 151 and a regrowth mask 153 (masking the n-doped region 102) that may be comprised of a substantially similar material as n-doped region 102 may remain in place. In addition, the present fabrication methods may involve usual processing steps such as chemical mechanical polishing (CMP), bonding, wet etching, etc.

Typically, there is a difference in terms of dopant concentration between, on the one hand, substrate 108 (e.g., an undoped or unintentionally doped III-V material, such as indium phosphide) and, on the other hand, the p-doped contact layer 104 (intentionally doped) as eventually obtained. This difference typically stems from the fact that the p-doped layer 104 is obtained by selective regrowth, a posteriori. Incidentally, certain designs as discussed herein may involve the selective regrowth of the indium phosphide layers around the active region.

The above embodiments have been succinctly described in reference to the accompanying drawings and may accommodate a number of variants. Several combinations of the above features may be contemplated. Examples are included in the following description.

In some embodiments, the fourth layer 105b is a residual portion of a seed layer as initially used to grow the stack 105, here assumed to be a multiple quantum well (MQW) stack. The fourth layer 105b is the cap layer of the initial deposition (e.g., by Metal-Organic Chemical Vapor Deposition (MOCVD)), which is upside down after bonding (e.g., to a SOI wafer, as shown in FIG. 4) and can then act as a seed layer for the p-doped and n-doped layers 102, 104, respectively. The fourth layer 105b and substrate 108 may be made of InP or another III-V compound material. The lateral n-doped and p-doped layers 102, 104 extend essentially parallel to a plane (e.g., x, y). The n-doped and p-doped layers 102, 104 are assumed to consist of doped InP in the example of FIGS. 1A-4. In some embodiments, additional III-V layers are present on top and bottom of the MQW active region 105, including first (SCH) layer 105a, e.g., comprising aluminum indium arsenide. The layers 105a, 105b may in fact be considered to form part of the active region 105.

Figure 2A:
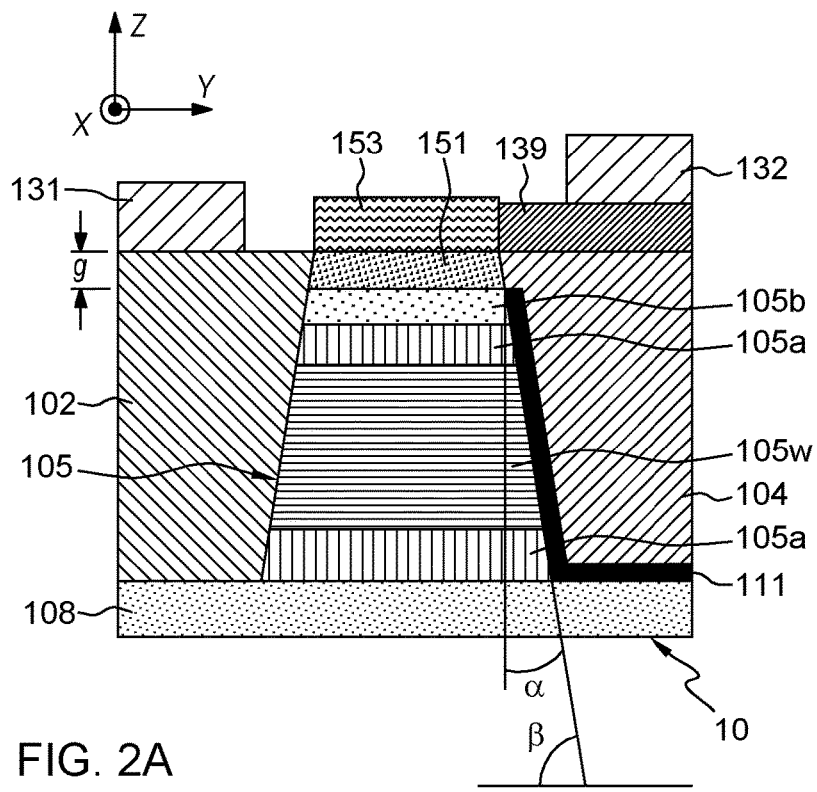
FIG. 2A illustrates a 2D cross-sectional view of the LCI, as obtained after the fabrication of lateral ohmic contacts, wherein a gap is further provided between one of the contacts and the EBL, according to embodiments of the present disclosure.
Figure 2B:
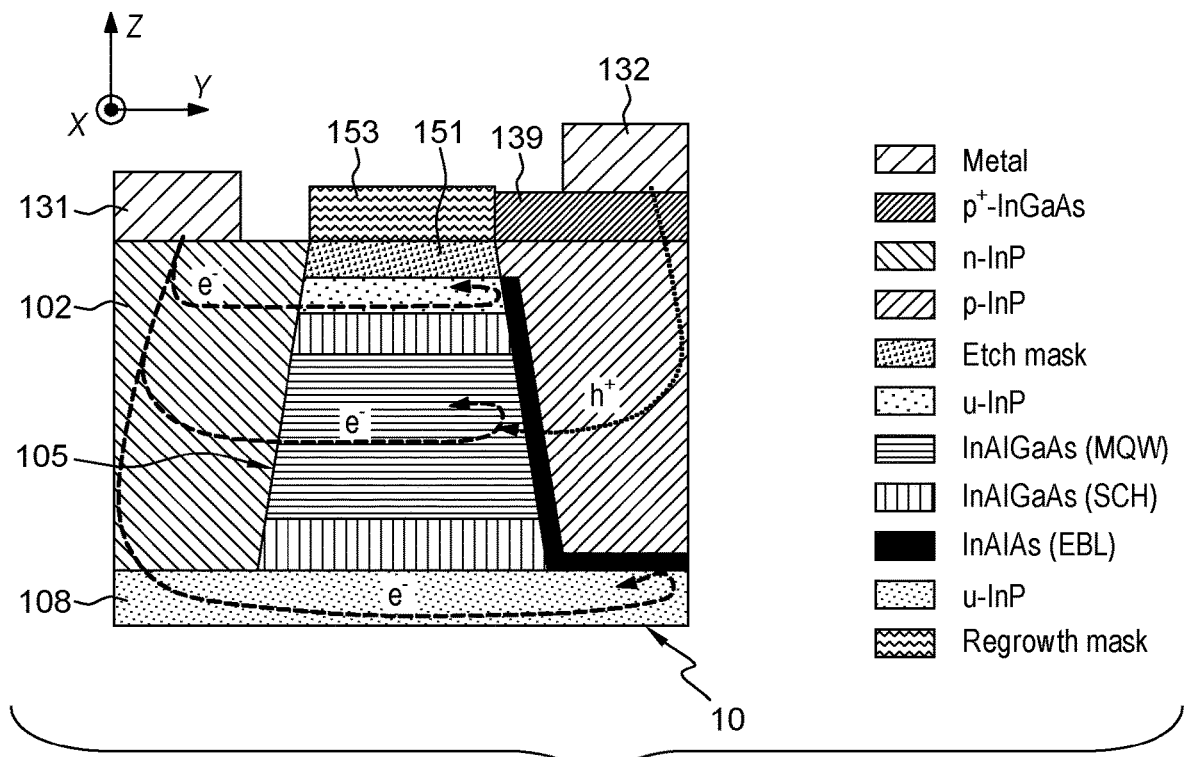
FIG. 2B further illustrates a role of the lateral EBL on possible trajectories of electrons and holes, according to embodiments of the present disclosure.
Figure 3A:
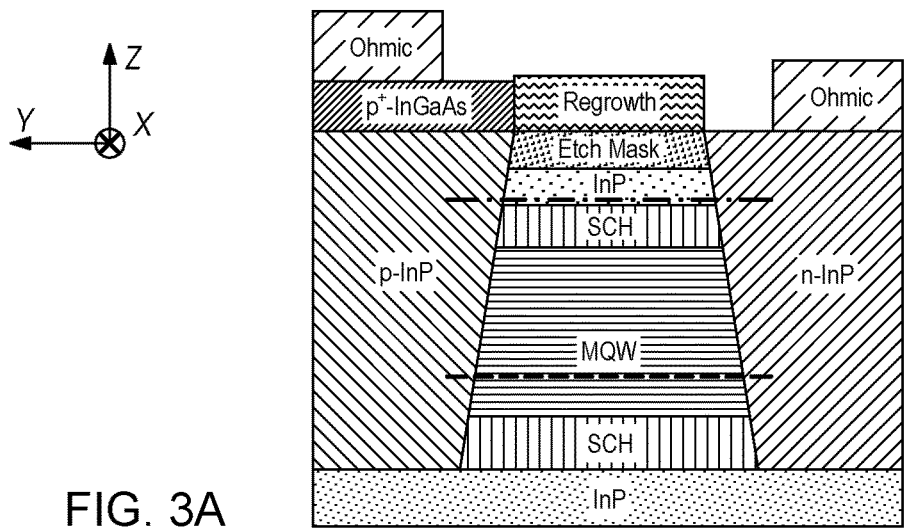
FIG. 3A illustrates a band diagram of electron leakage paths for the LCI device without an EBL, according to embodiments of the present disclosure.

In reference to FIGS. 2A and 2B, an aspect of the present disclosure is described, which concerns a lateral current injection (LCI) electro-optical device 10, e.g., an optoelectronic device such as an edge-emitting laser device. Such a device is hereafter referred to as an "LCI device", or even as a "device", for simplicity.

Turning now to FIG. 2A, an LCI device 10 may include the substrate 108. The substrate 108 is typically coated with a material layer comprising indium phosphide or another type of III-V compound material on top. The substrate 108 provided may for instance be a silicon-on-insulator wafer, whose top silicon layer is structured for optical coupling purposes, as discussed later in detail.

The LCI device 10 may also comprise the active region 105. This active region 105 essentially comprises a stack of III-V semiconductor gain materials, i.e., materials from the group of III-V compound semiconductors that provide the gain medium, so as to achieve optical amplification of radiations of interest. As illustrated in the accompanying drawings, the III-V materials of the active region 105 are stacked along a stacking direction that is substantially perpendicular to the average plane of the substrate 108.

In some embodiments, the active region 105 may be a shallow III-V stack, e.g., less than 500 nm or 450 nm thick (as measured above the substrate 108), to ease the monolithic integration of the LCI device 10 on Si CMOS platforms. Still, shallower III-V stacks can be contemplated, if necessary.

The active region 105 may be tapered (e.g., flared), so as to widen toward the substrate 108. The active region 105 typically resembles a truncated pyramid, having at least four faces including its base, which is in contact with the substrate 108. Thus, lateral sides (flanks) of the active region 105 are apparent from a top-down view, just like pyramidal outer triangular surfaces are when viewed from the top.

The LCI device 10 may further include the pair of doped layers 102, 104 of III-V semiconductor materials. The pair includes an n-doped layer 102 and a p-doped layer 104. Layers 102, 104 are arranged on the substrate 108 and, more precisely, on opposite, lateral sides of the tapered active region 105. Lateral current injection can be achieved via metal contacts, through-vias or traces contacting the n-doped and p-doped regions.

Moreover, the present LCI devices 10 comprise a lateral EBL 111. The EBL 111 extends along two interfaces that are normally contiguous. Namely, the first interface is between the p-doped layer 104 and the substrate 108, and the second interface is between the tapered portion of the active region 105 and the p-doped layer 104. Thus, the EBL extends both on a lateral side of the III-V stack 105 and on the substrate 108. The upper portion of the EBL 111 is transverse to the substrate (but not perpendicular, owing to the tapered profile of the active region 105). The lower portion of the EBL 111 is parallel to the substrate.

The tapered section of the active region 105 makes it possible to deposit the desired EBL 111 from the top, e.g., by molecular beam epitaxy (MBE) or by metal-organic chemical vapor deposition (MOCVD). As lateral sides of the active region 105 are apparent from the top (in part due to its flared profile), particles can deposit and "hook" on a lateral side of the active region 105.

The two portions of the EBL 111 (i.e., the upper and lower portions) are normally contiguous, unless the active region is provided with a complex profile. Indeed, the active region 105 may for example have a tapered upper section (lateral flanks of which are transverse but not perpendicular to the substrate, such that EBL 111 particles can be deposited thereon, from the top) and a straight lower section (lateral flanks of which are perpendicular to the substrate, such that EBL 111 particles cannot easily be deposited from the top). In all cases, the active region 105 comprises at least a tapered (or flared) section.

As seen in the accompanying drawings, the EBL 111 may be deposited so as for it to notably extend laterally to the active region 105, i.e., between the III-V active region 105 and the p-doped region 104. The EBL 111 further extends between the p-doped layer 104 and the substrate 108, i.e., at an interface that is contiguous with the interface between the III-V active region 105 and the p-doped layer.

The EBL 111 advantageously prevents electron leakage from the n-side of the active region 105 to the p-side. At least, the lateral EBL 111 makes possible to lower such leakage currents, which accordingly allows a higher output power to be achieved in the present LCI device 10. Indeed, and as discussed herein, generally, LCI devices usually suffer from parasitic leakage currents that impact their efficiency. In particular, electron leakage from the n-side of the active region 105 to its p-side may limit the maximum achievable output power. In some embodiments, the lateral EBL 111 prevents electrons from creating n- to p-side leakage currents, which accordingly allows a higher output power to be achieved. Note that the EBL 111 is essentially blocking for electrons in the conduction band of the III-V active region 105 but is not necessarily blocking for holes, i.e., missing electrons in the valence band of the stack.

In embodiments, the active region 105 is tapered so as for a lateral side of the tapered active region 105 (on which the EBL 111 extends) to deviate from the stacking direction that is the norm to the substrate's 108 surface by an angle $\alpha$ that is between 5° and 70°. The angle $\alpha$ can be regarded as the half-angle of aperture of the taper (i.e., the angle defined between the norm of the surface of the substrate 108 and a lateral, inclined flank of the active region 105, on which the EBL 111 extends). In other words, the opposite angle $\beta$, formed by the inclined flank with respect to the average plane of the substrate is between 20 and 85°. The more inclined this lateral flank with respect to the substrate's 108 norm, the easier it may be to obtain the desired EBL 111. Still, there may be a trade-off between the mode confinement and regrowth properties, as recognized by the Inventors. Thus, in practice the angle α may be between 10° and 30°, e.g., of about 20° which corresponds to β=70°.

In some embodiments, the EBL 111 may have an average thickness that is between 5 nm and 100 nm. The average thicknesses of the upper and lower portions of the EBL 111 may differ. On the one hand, 5 nm may typically be necessary to prevent electron tunneling between the active region and the p-doped contact layer—it being noted that III-V compound materials may be used for the EBL 111. On the other hand, the EBL will typically not need to be thicker than 100 nm or, even, 50 nm, if a carefully chosen III-V material is used for the EBL 111. A more efficient electron blocking may nevertheless be achieved with layers thicker than 10 nm. The EBL 111 may notably have an average thickness that is between 20 nm and 40 nm, e.g., when using aluminum indium arsenide for the EBL 111 layer.

As noted earlier, the n- and p-contact layers 102, 104 are arranged on opposite, lateral sides of the active stack 105. Lateral current injection can be achieved via metal contacts, through-vias or traces contacting the n-doped and p-doped regions. For instance, in typical embodiments, ohmic contacts may be provided, e.g., upon completion of the device fabrication or its integration in a silicon photonics chip. The LCI device 10 may for instance comprise a first ohmic contact 131, a second ohmic contact 132, and third ohmic contact 139. The three ohmic contacts are respectively formed on the n-doped layer 102 and the p-doped layer 104, the second ohmic contact 132 of which is formed on top of the third ohmic contact 139.

In some embodiments, a gap g may be provided between the third ohmic contact 139 and the EBL 111. This gap may extend along the inclined flank of the active region 105 (and may extend parallel to the stacking direction z). As a result, the EBL 111 may not be in direct contact with the second ohmic contact 132 or the third ohmic contact 139. This gap g makes it easy to avoid (or at least substantially lower) electron leakage through the ohmic contacts 139, 132.

Note that the ohmic contacts 131, 132 may consist of substantially the same material, for the sake of simplifying the fabrication process. In variants, the ohmic contact layers 131, 132 may differ in material and be individually chosen so as to optimize the ohmic contacts to each of the individual n- and p-doped layers 102, 104.

As one may realize, the gap g may be provided (vertically) between the EBL 111 and any conductive layer in contact with the p-side ohmic contact 139. In particular, in embodiments, the second ohmic contact 132 and the third ohmic contact 139 may comprise a doped III-V semiconductor compound. This third ohmic contact layer 139 may, e.g., comprise a heavily doped InGaAs (p$^+$-InGaAs). In that case, the gap g needs to be provided between the EBL 111 and the third ohmic contact layer 139 to avoid electron leakage through the third ohmic contact layer 139.

As further seen in FIG. 2A, the electro-optical device 10 may further comprise a residual, etch mask layer portion 151 on top of the active region 105 and a regrowth mask 153. The etch mask layer portion 151 may be opposite the substrate 108 with respect to the active stack 105. Thus, the gap g between the EBL 111 and the third ohmic contact layer 139 may be at least partly ensured by a lateral side portion of the residual etch mask layer 151. That is, the residual etch mask layer 151 may have a lateral flank, along which the EBL layer 111 only partly extends toward the top. Thus, a residual, lateral portion of the flank may not be coated by EBL layer 111, thereby providing the desired gap g between the EBL layer 111 and the third ohmic contact 139.

The stack of III-V semiconductor gain materials may for instance comprise such compounds as $In_{1-x-y}Al_xGa_yAs$, $In_{1-x}Ga_xAs_yP_{1-y}$, and $In_{1-x}Ga_xAs_yN_{1-y}$, where $0 \leq x \leq 1$ and $0 \leq y \leq 1-x$. For example, the active region 105 may include InAs quantum dots and/or InAlGaAs quantum wells. Such an active region 105 may be relatively easy to grow, e.g., by molecular beam epitaxy (MBE) or metal organic chemical vapor deposition (MOCVD). The semiconductor materials can be doped, as necessary, and may be in conjunction with strain, e.g., to tune the bandgap.

The III-V active region 105 may notably be configured as a multiple quantum well (MQW) section, sandwiched between other III-V materials, such as first or third layers 105a, e.g., made of InP or GaAs. Meanwhile, each of the n-doped layer 102 and the p-doped layer 104 typically comprises InP, InAs, or GaAs (or compounds thereof).

In embodiments as illustrated in FIG. 2A, the active region 105 of the LCI device 10 comprises a second (MQW) layer 105w, sandwiched between first and third (SCH) layers 105a. The active region 105 further comprises the fourth layer 105b, e.g., a residual layer portion of III-V semiconductor compound materials (e.g., InP) as initially used to grow the active region 105. The residual seed layer portion 105b may extend between the residual etch mask layer portion 151 and the third layer 105a, opposite the substrate 108 with respect to the second layer 105w. As further seen in FIG. 2A, an upper portion of the EBL 111 extends, laterally, at the interface between the active region 105 and the p-contact layer 104. In the vertical direction, the upper portion of the EBL 111 may extend beyond the fourth layer 105b, and up to said etch mask layer portion 151.

Turning now to FIG. 2B, three paths of electrons (e$^-$) and a single path of electron holes (h$^+$) traversing throughout the device 10 are illustrated. The electrons are following one of three paths, which all begin in the ohmic contact 131. The first path shown enters a first layer of the active stack 105 until reaching the EBL 111. Given the properties of the EBL 111, the electrons may not tunnel through the EBL 111 and into the p-doped layer and, therefore, stay, at least in part, in the active stack 105. The second path shown is of the electrons entering a second layer of the active stack 105, of which the electrons are blocked by the EBL 111. The third path shows the electrons entering the substrate 108 from the n-doped layer 102, and are blocked by the EBL 111. The electron hole path is shown beginning from the ohmic contact 132, traversing through the opposite ohmic contact layer 139, and into p-doped layer where the electron hole tunnels through the EBL 111, entering the active stack 105. The device 10 also includes the etch mask 151 and the regrowth mask 153.

As noted earlier, the EBL 111 may essentially block electrons in the conduction band of the III-V active region 105. This aspect is now described in detail with reference to FIGS. 3A-3F. Such figures may depict band diagrams illustrating electron leakage paths for a device without an electron blocking layer (FIGS. 3A-3C) and for a device comprising an electron blocking layer (FIGS. 3D-3F). Note that the y-axis is reversed in the device designs shown in FIGS. 3A, and 3D, compared with FIGS. 1 A-F and 2 A-B. The design of FIG. 3D is otherwise similar to that of FIGS. 2A and 2B.

Turning now to FIG. 3A, a device, excluding an EBL portion, is shown to provide a comparison of a device that includes an EBL and a device that does not include an EBL to show the effect of the EBL on blocking an electron path. A device can be seen that includes two ohmic contact portions, a regrowth portion, an etch mask portion, an InP portion, two SCH portions, an MQW portion, an InP substrate, a p-InP portion, an n-InP portion, and a p+-InGaAs portion. An EBL portion is not included in the device. FIG. 3A additionally includes two lines, each representing an electron path. The first electron path is shown traversing through the InP portion and the second path is shown traversing through the MQW portion.

Figure 3B:
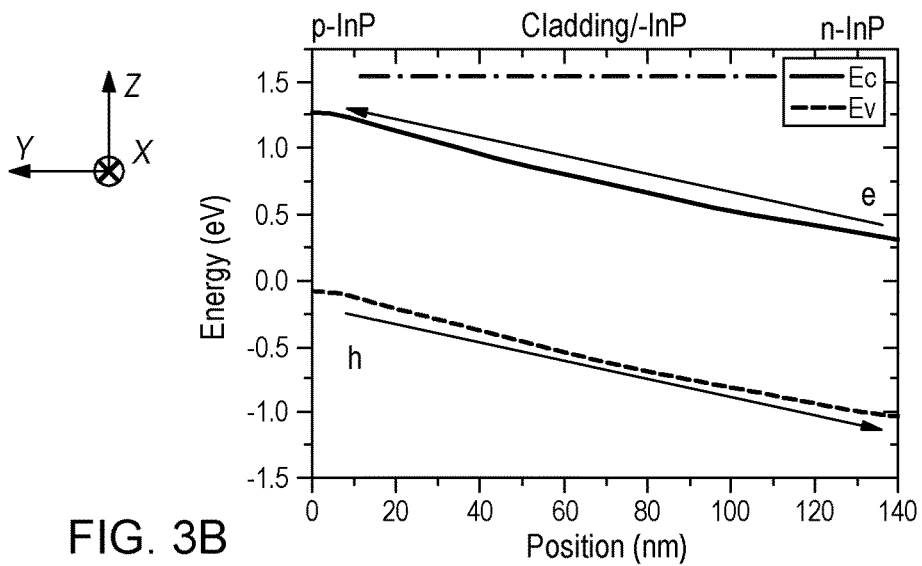
FIG. 3B illustrates a graph of the relationship between the energy of electrons and positrons and the horizontal position of them travelling through an indium phosphide portion of the LCI device, according to embodiments of the present disclosure.
Figure 4:
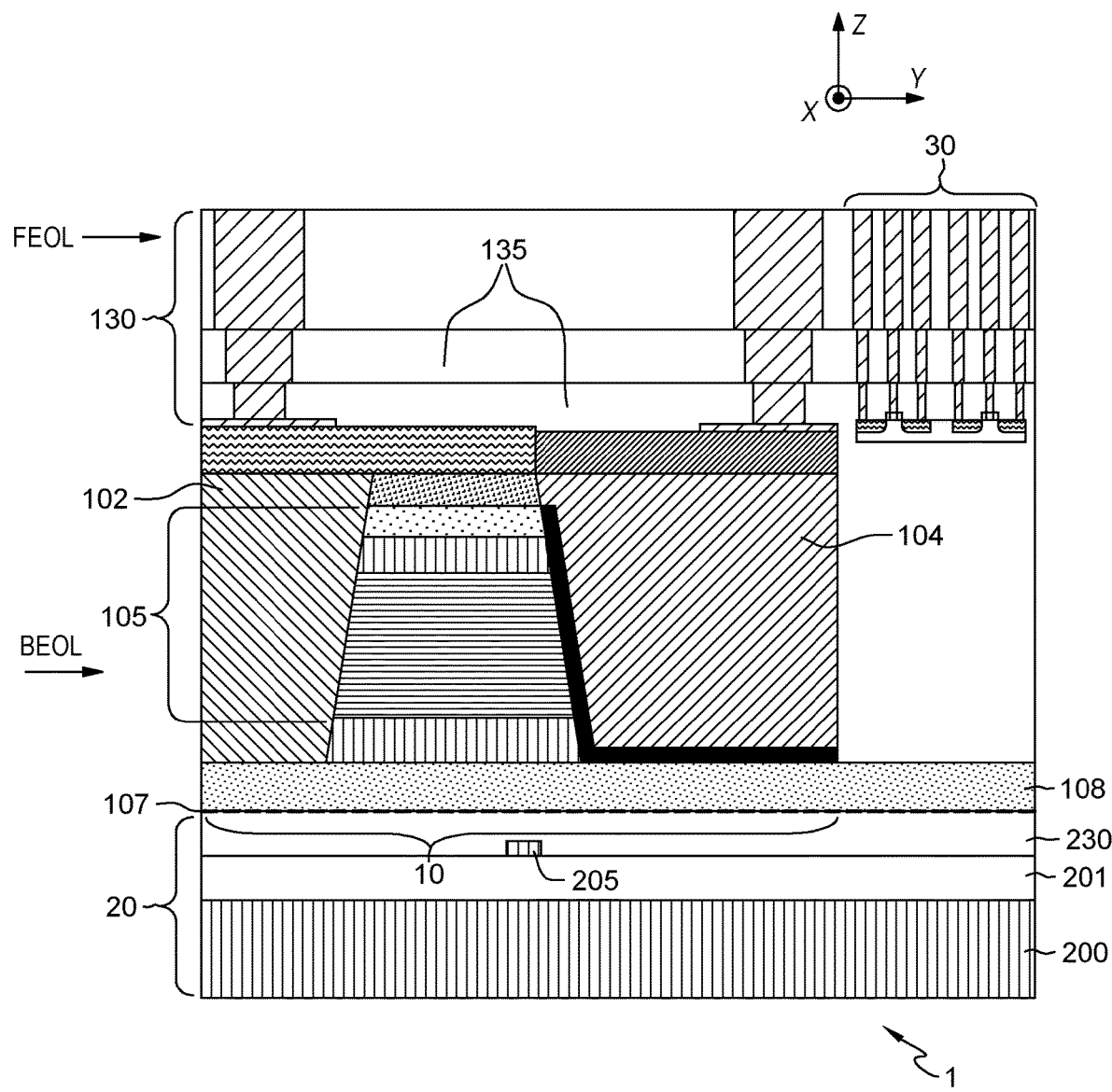
FIG. 4 illustrates a 2D cross-sectional view of a silicon photonics chip including the LCI device, as well as other components, according to embodiments of the present disclosure.

FIG. 3B illustrates a graph of the first electron path through the InP portion of the device and of a second electron hole path through the InP portion. The graph illustrates the relationship between the position of the electrons (or electron holes) within the device and the energy (eV) at a particular position within the device.

Figure 3C:
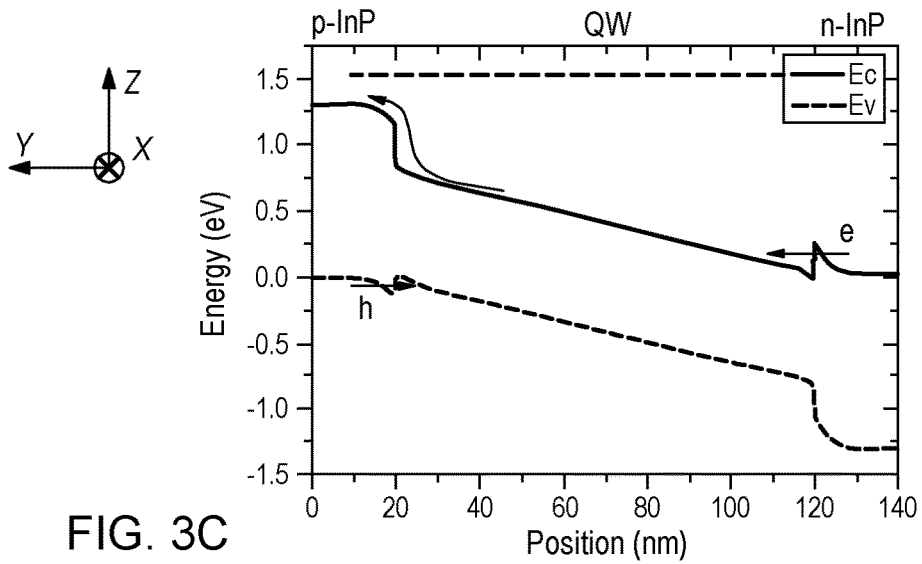
FIG. 3C illustrates a graph of the relationship between the energy of electrons and positrons and the horizontal position of them travelling through a multiple quantum well portion of the LCI device, according to embodiments of the present disclosure.
Figure 3D:
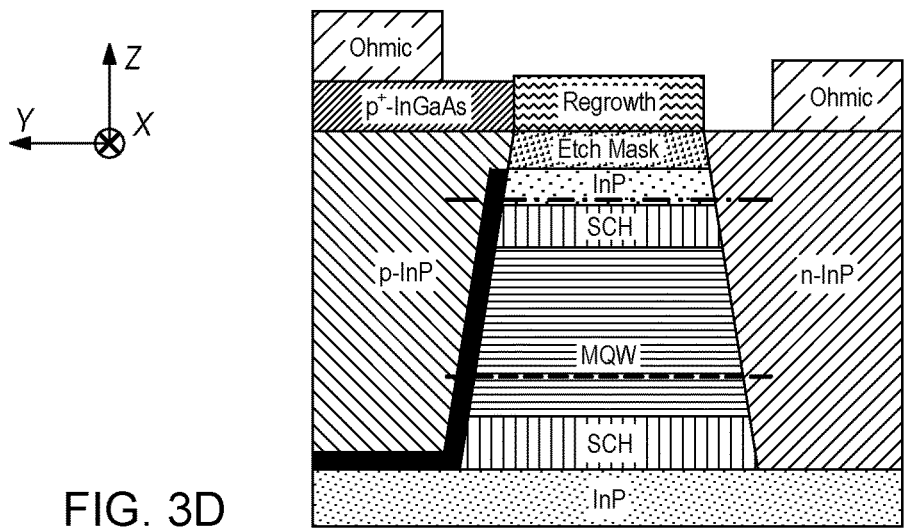
FIG. 3D illustrates a band diagram of electron paths for the LCI device with an EBL, according to embodiments of the present disclosure.
Figure 3E:
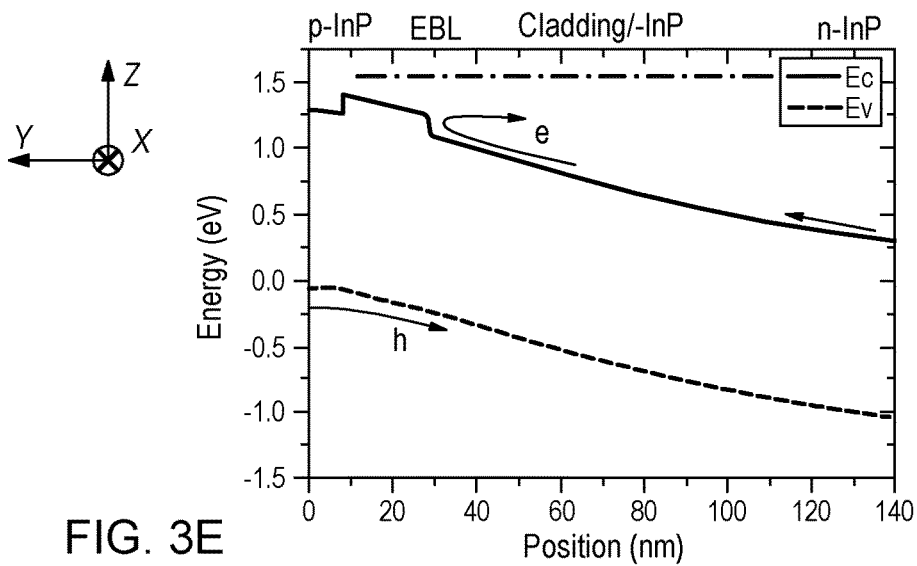
FIG. 3E illustrates a graph of the relationship between the energy of electrons and positrons and the horizontal position of them travelling through the indium phosphide portion of the LCI device that includes the electron blocking layer, according to embodiments of the present disclosure.
Figure 3F:
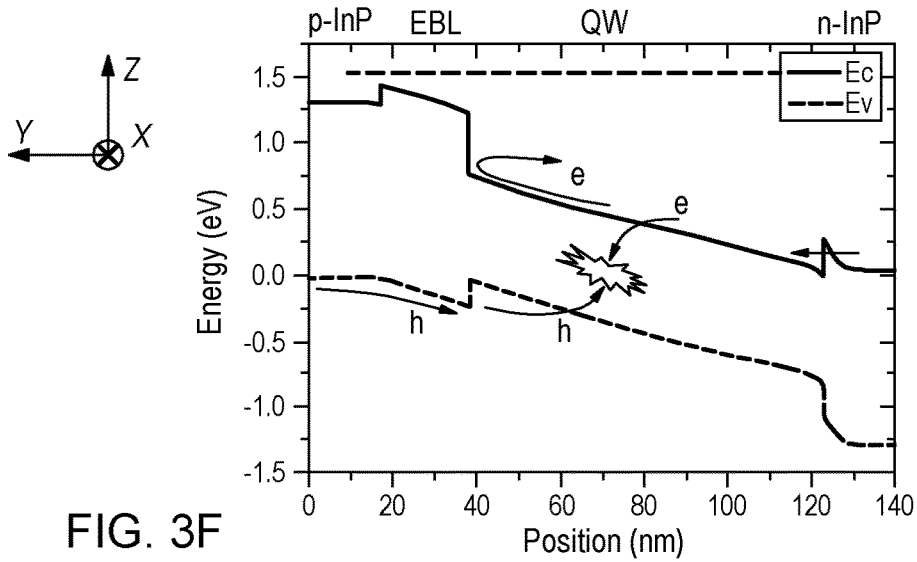
FIG. 3F illustrates a graph of the relationship between the energy of electrons and positrons and the horizontal position of them travelling through a multiple quantum well portion of the LCI device that includes electron blocking layer, according to embodiments of the present disclosure.

FIG. 3C illustrates a graph of the second electron path through the MQW portion of the device and of a second electron hole path through the MQW portion. The graph illustrates the relationship between the position of the electrons (or electron holes) within the device and the energy (eV) at a particular position within the device.

As seen in FIGS. 3D and 3F, the EBL 111 may be designed so as to have a positive conduction band offset, in energy, with respect to a conduction band of the III-V active region 105. This offset corresponds to an energy barrier that an electron must overcome (see FIG. 3F) in order to pass from the III-V stack 105 to the EBL, when travelling toward the p-doped layer 104, in an average direction that is perpendicular to the stacking direction z (i.e., horizontally, from right to left and along the dotted line in FIG. 3D). This offset is assumed to be sufficient to prevent an electron to pass, by tunnel effect, from the active region 105 to the p-contact layer 104, via the EBL 111. On the contrary, in FIG. 3C, the absence of any lateral EBL 111 results in a smaller offset, such that electrons can more easily overcome the energy barrier towards the p-InP and hence toward the p-contact layer 104.

As seen in FIG. 3E, the EBL 111 may further be designed so as to have a positive conduction band offset, in energy, with respect to a conduction band of the fourth layer 105b, to prevent an electron to pass, by tunnel effect, from the residual seed layer 105b (here assumed to be InP) to the p-contact layer 104, via the EBL 111 (i.e., horizontally, from right to left and along the large dashed line in FIG. 3D). On the contrary, in FIG. 3B, no such offset is visible and electrons can simply pass from the InP layer to the p-contact layer 104.

As further illustrated in FIG. 3F, since electron leakage may be prevented by the EBL 11, electrons have a propensity to stay inside the multiple quantum well, thus allowing for a larger probability of electron-hole recombinations, which makes it possible to achieve a larger output power.

As further seen in FIG. 3F, the EBL 111 may be designed so as to have a negative valence band offset, in energy, with respect to the valence band of the III-V active region 105. Yet this offset is positive when passing from the EBL 111 to the III-V active region 105. Thus, this offset makes it possible for holes to pass from the EBL 111 to the III-V active region 105, when travelling from the p-doped layer 104 in an average direction that is perpendicular to the stacking direction z. In variants (not shown), the EBL 111 can be designed so as to have a zero or slightly positive valence band offset, in energy, with respect to the valence band of the III-V active region 105.

As a result of the present designs, certain electron trajectories may not be permitted, as illustrated in FIG. 2B, where electrons (e−) traveling from the n-doped region are not allowed to pass through the EBL barrier 111. On the other hand, electron holes (h+, as shown in FIG. 2B) originating from the p-doped region can pass the EBL 111 without any mitigation.

The EBL 111 may comprise InAlAs. In variants, it may comprise InAlGaAs too or, still, other III-V compounds. In some embodiments, InAlAs may be in terms of conduction band offsets. For instance, when using InAlGaAs, the presence of Ga may typically cause to reduce the conduction band offset. Similarly, the use of other materials may lead to less optimal conduction band offsets. In some embodiments, the material chosen for the EBL 111 may be lattice-matched to the substrate 108. For example, the composition of the InAlAs layer 111 may be lattice-matched to an InP substrate 108.

Aspects of the present disclosure may include a lateral current injection, edge-emitting laser devices. In embodiments, such devices are embodied as single mode laser devices. To that aim, suitably structured waveguides may be involved, e.g., which are tapered so as to filter out high-order modes (not shown, such waveguides may, e.g., comprise n-doped InP).

More generally though, the present devices may be configured as optical detectors or semiconductor optical amplifiers (SOAs). Thus, in general, the III-V active region 105 may be designed so as to be capable of producing, detecting, or amplifying radiation in a given range of wavelengths and, in particular, at a given average radiation wavelength.

The wavelength range of interest is in the optical range i.e., 100 nm-1 mm, according to DIN 5031. Thus, the terminology "radiation" as used herein refers to electromagnetic radiation in the wavelength range between 100 nm and 1 mm. However, the wavelength range will, in most applications as contemplated herein, be between 200 nm and 7.5 µm. In particular, wavelengths of 1.3 and 1.55 µm are typically contemplated (and possibly 980 nm), for datacom and telecom applications.

Turning now to FIG. 4, an LCI device 10 in conjunction with other components can be seen. As described above, the present devices (e.g., LCI device 10) may typically include waveguide cores (suitably cladded) for coupling radiation to and/or from the active region 105. For example, and as seen in FIG. 4, a silicon (Si) waveguide core may be provided below the active region 105 to out-couple radiation therefrom. In variants (not shown), the present devices may include waveguide cores provided on the same level as the active region 105 (and incidentally on the same level as the p-doped layer 104 and the n-doped layer 102), so as to obtain a more efficient optical out-coupling.

In general, the Si waveguide cores may comprise Bragg mirrors (e.g., defined by periodic etches of the Si material), configured so as to provide a radiation feedback for the laser. Similarly, grating couplers may be formed directly in the Si material. LCI device 10 may notably be embodied as a Distributed Bragg Reflector laser. In variants, they may be designed as a racetrack resonator. Still, the Si resonator can be designed as a distributed feedback resonator, with the Si waveguide cores extending below the III-V stack.

Still referring to FIG. 4, another aspect of the present disclosure is now described, which concerns a Si photonics chip 1. The chip 1 notably comprises a LCI device 10 such as described herein. Conversely, the present LCI device 10 can be regarded as forming part (or intended to form part) of a Si photonics chip 1. Still, the present Si photonics chip 1 can be regarded as electro-optical devices and, in particular, as optoelectronic devices, involving, at least locally, a lateral current injection structure.

As described herein, the present photonics chips may include one or more Si waveguide cores 200, 205 for optical coupling purposes. For example, the Si waveguide cores 205 may generally be configured so as for optical radiation that gets out-coupled from the active region 105 of the LCI device 10 to couple into the one or more of the silicon waveguide cores 205, in operation.

A bonding layer 107 is typically used at the interface between the two structured wafer components (e.g., formed, on the one hand, by a cladded SOI wafer component 20 and, on the other hand, by the cladded LCI device 10). The bonding layer 107 may in fact result from two separately deposited layers. For completeness, the upper components 102, 104, and 105 may be cladded with, e.g., oxide layers 135, which may comprise $SiO_2$ or $Al_2O_3$, just like layers 201, 230 of the SOI wafer.

As described herein, the present Si photonic chips may comprise a silicon on insulator (SOI) wafer component 20, whose top Si layer is structured so as to form one or more structured Si waveguide cores 205. Substrate 108 (e.g., InP) as described in reference to LCI devices 10 is, in that case, typically arranged between the active region 105 and the SOI wafer 20. Additional Si components may possibly be present (e.g., a heater, not shown), which may for instance be structured from that same top Si layer of the wafer 20. Also, the Si waveguide cores may further be structured so as to comprise Distributed Bragg reflectors (DBRs) or other optical structures (e.g., grating couplers), as necessary for the desired couplings.

In general, all variants discussed herein in reference to the electro-optical devices 10 may apply to electro-optical devices included in the present Si photonics chips. For example, ohmic contacts may be formed on the n-doped layer 102 and the p-doped layer 104, such as to provide a (vertical) gap between one of the ohmic contacts and the EBL 111, as discussed earlier.

In some embodiments, the present Si photonic chips 1 are complementary metal-oxide-semiconductor (CMOS) fabricated devices, which therefore include CMOS-compatible metal contacts, vias and metal pads, etc., as depicted in region 130 (the front-end-of-line (FEOL) portion) of the device 1. Cladding material 135 may in that case be compatible with the integration of metal interconnects for CMOS circuits.

In some embodiments, the Si photonic chip 1 may include a CMOS-compatible LCI device 10, which is embedded in the back end of the line (BEOL) of the Si photonic chip 1. Several devices 10 could in fact be present (not shown). Furthermore, such device(s) 10 may be co-integrated, in the BEOL of the chip 1, with one or more CMOS-fabricated integrated circuits 30. For instance, the circuits 30 may include transistors configured for driving the electro-optical LCI device 10, where all appropriate contacts for, e.g., circuit components 10, 20 may have been provided in the upper stack 130.

In FIGS. 1A-4, sets of ohmic contacts (metal-semiconductor contacts) for the LCI device 10 are formed by metal ohmic contacts 131, 132 which may themselves be joined by vertical metal vias and top metal pads (as seen in FIG. 4), provided in the upper region 130. The top metal pads may possibly be radiofrequency (RF) electrodes, although RF pads are not always needed, e.g., and notably not in case of full integration with transistors included in integrated circuit 30. In all cases, the contacts are arranged so as to enable lateral current injection in the active region 105. The ohmic contacts comprise n- and p-type contacts, respectively in contact with the n-doped layer 102 and the p-doped layer 104.

The chip 1 may further involve metal contacts extending in the upper region 130, so as to contact both the electro-optical device 10 and the neighboring circuit component 30. In the device 10, the cladding layers 201, 230, and 135 typically comprise a same material, e.g., $SiO_2$, Sapphire (i.e., crystalline $Al_2O_3$) or amorphous $Al_2O_3$. In some embodiments, the cladding layers comprise $SiO_2$. Next, the III-V stack 105 may comprise $In_{1-x-y}Al_xGa_yAs$ ($0 \le x \le 1$, $0 \le y \le 1-x$), as mentioned earlier. A range of materials can thus be contemplated, including InAs, AlAs, InGaAs (e.g., for quantum dots lasers) and InAlGaAs. In particular, InAs quantum dots can be contemplated when using a GaAs substrate. In variants, the III-V active region 105 may comprise InGaAsP or InGaAsN. In general, the III-V active region 105 may be configured as a MQW section sandwiched between other III-V materials, e.g. InP, or GaAs, lattice matched to the MQW section to prevent oxidation, as needed to start the growth of the core III-V stacked layers. The III-V active region 105 may also comprise quantum dots sandwiched between quantum wells, as known per se.

Active region 105 may be relatively easy to grow, e.g., by MBE or MOCVD. The semiconductor materials can be doped, as necessary, and may be in conjunction with strain, e.g., to tune the bandgap.

In embodiments, the present electro-optical devices 10 are embodied as a III-V on silicon photonics laser device, dimensioned so as to allow a low threshold current. For example, a very small device (micrometer-scale) can be contemplated, so as to enable high-speed operation and large scale integration.

The Si waveguide cores may be optically coupled to the III-V optical gain medium, which is laterally sandwiched between an electron medium and a hole injection medium. InGaAlAs quantum wells or dots may be used, owing to their thermal stability.

The III-V thin slab is bonded to the SOI wafer using a thin layer of aluminum oxide. The III-V slab may possibly be patterned as a rib waveguide, containing the active region 105. The n-doped and p-doped regions 102, 104 are separated by the active region 105 and extend on both sides of the active region 105, as made possible by selective regrowth around the active region 105.

The selective regrowth of the n-doped and p-doped regions 102, 104 may not only allow a clean separation, but, in addition, makes it possible to improve the ohmic contacts and obtain high doping levels. Moreover, 2D monolithic integration can be contemplated in the back-end of the line of a CMOS chip, using standard processes.

A fabrication process is now described, according to some embodiments. First, a SOI wafer is provided. Second, the top Si layer of the SOI wafer is structured using electron beam lithography (EBL), or deep UV lithography for mass production in a foundry, to shape a resist on top of the top Si layer, followed by inductively coupled plasma (ICP), or reactive ion etching (RIE). Tapered Si waveguide cores can be accordingly obtained. Third, after having removed the residual resist portion, plasma-enhanced chemical vapor deposition (PECVD) may be used to clad (with silica) the tapered Si waveguide cores. The deposited cladding layer is subsequently polished by CMP. A III-V wafer is then bonded onto the processed SOI wafer. Fifth, the III-V substrate is removed by wet etching of the sacrificial layer grown on the III-V substrate before the active region. Next, ICP etching is used to obtain the tapered multiple quantum well (MQW) section sandwiched between other III-V materials, e.g. InP. Seventh, the contact (n- and p-doped) layers are selectively regrown by metal-organic chemical vapor deposition (MOCVD). The EBL 111 is deposited prior to re-growing the p-doped contact layer 104. Then, another PECVD step is performed to clad (with silica) the n-doped and p-doped layers 102, 104. Vias may be opened in the cladding layer by RIE and wet etching techniques. Ohmic contacts and metal contacts are deposited and patterned by a dry etching (or lift-off process).

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For examples, other materials than those explicitly cited may be contemplated.

What is claimed is:

1. A lateral current injection electro-optical device, comprising:
    a substrate;
    an active region on the substrate, wherein the active region:
        comprises a stack of III-V semiconductor gain materials stacked along a stacking direction z that extends substantially perpendicular to a plane of the substrate; and
        is tapered so as to widen toward the substrate;
    a pair of doped layers of III-V semiconductor materials, the pair including an n-doped layer and a p-doped layer arranged on the substrate and on opposite, lateral sides of the tapered active region, respectively; and
    an electron blocking layer with an average thickness between 10 nm and 50 nm, extending both at:
        a first interface between the p-doped layer and the substrate; and
        a second interface between the tapered active region and the p-doped layer.

2. The electro-optical device according to claim 1, wherein the active region is tapered such that a lateral side of the tapered active region on which the electron blocking layer extends deviates from the stacking direction z by an angle α that is between 5° and 70°.

3. The electro-optical device according to claim 2, wherein the angle α is between 10° and 30°.

4. The electro-optical device according to claim 1 wherein the electron blocking layer comprises InAlAs.

5. The electro-optical device according to claim 1, further comprising:
    a first ohmic contact and a second ohmic contact respectively formed on the n-doped layer and the p-doped layer, opposite to the substrate, and
    a gap provided in a direction parallel to a stacking direction z, between the second ohmic contact and the electron blocking layer, whereby the electron blocking layer is not in direct contact with the second ohmic contact.

6. The electro-optical device according to claim 5, wherein
    the second ohmic contact includes an ohmic contact layer that comprises a doped III-V semiconductor compound, and
    the gap is provided between the electron blocking layer and the ohmic contact layer that comprises the doped III-V semiconductor compound.

7. The electro-optical device according to claim 6, further comprising:
    an etch mask layer on top of the active region, opposite the substrate, wherein the gap between the electron blocking layer and the ohmic contact layer is at least partly provided by a lateral side portion of the etch mask layer.

8. The electro-optical device according to claim 7, wherein the active region comprises:
    a multiple quantum well section sandwiched between separate confinement heterostructure layers; and
    a residual seed layer between the etch mask layer and one of the separate confinement heterostructure layers, the residual layer being opposite the substrate with respect to the multiple quantum well section,
    wherein the electron blocking layer extends beyond the residual seed layer, up to the etch mask layer.

9. The electro-optical device according to claim 1, wherein
    the electron blocking layer has a positive conduction band offset, in energy, with respect to a conduction band of the III-V stack, the offset corresponding to an energy offset that an electron needs to overcome in order to pass from the III-V stack to the electron blocking layer when travelling toward the p-doped layer in a direction that is perpendicular to the stacking direction z.

10. The electro-optical device according to claim 9, wherein
    the electron blocking layer has a negative valence band offset, in energy, with respect to a valence band of the III-V active region.

11. The electro-optical device according to claim 1, wherein the electro-optical device is a lateral current injection laser device.

12. The electro-optical device according to claim 1, wherein the stack of III V semiconductor gain materials is selected from the group consisting of:
    $In_{1-x-y}Al_xGa_yAs$;
    $In_{1-x}Ga_xAs_yP_{1-y}$; and
    $In_{1-x}Ga_xAs_yN_{1-y}$,
wherein $0 \leq x \leq 1$ and $0 \leq y \leq 1$ x, and wherein each of the p-doped layer and the n-doped layer is selected from the group consisting of:
    InP;
    InAs; and
    GaAs.

13. A device, comprising:
a silicon photonics chip, the silicon photonics chip comprising:
   a substrate;
   an active region on the substrate, wherein the active region:
      comprises a stack of III-V semiconductor gain materials stacked along a stacking direction z that extends substantially perpendicular to a plane of the substrate; and
      is tapered so as to widen toward the substrate;
   a pair of doped layers of III-V semiconductor materials, the pair including an n-doped layer and a p-doped layer arranged on the substrate and on opposite, lateral sides of the tapered active region, respectively;
   a first ohmic contact and a second ohmic contact respectively formed on the n-doped layer and the p-doped layer, opposite to the substrate, wherein the second ohmic contact includes an ohmic contact layer that comprises a doped III-V semiconductor compound;
   a gap provided in a direction parallel to a stacking direction z, between an electron blocking layer and the ohmic contact layer that comprises the doped III-V semiconductor compound, whereby the electron blocking layer is not in direct contact with the second ohmic contact; and
   the electron blocking layer, extending both at:
      a first interface between the p-doped layer and the substrate; and
      a second interface between the tapered active region and the p-doped layer.

14. The device according to claim 13, wherein the active region is tapered such that a lateral side of the tapered active region on which the electron blocking layer extends deviates from the stacking direction z by an angle α that is between 10° and 30°.

15. The device according to claim 14, wherein the electron blocking layer has an average thickness between 10 nm and 50 nm.

16. The device according to claim 15, wherein the electron blocking layer comprises InAlAs.

17. The device according to claim 13, further comprising:
an etch mask layer on top of the active region, opposite the substrate, wherein the gap between the electron blocking layer and the ohmic contact layer is at least partly provided by a lateral side portion of the etch mask layer.

18. A silicon photonics chip, comprising:
a substrate;
an active region on the substrate, wherein the active region:
   comprises a stack of III-V semiconductor gain materials stacked along a stacking direction z that extends substantially perpendicular to a plane of the substrate; and
   is tapered so as to widen toward the substrate;
a pair of doped layers of III-V semiconductor materials, the pair including an n-doped layer and a p-doped layer arranged on the substrate and on opposite, lateral sides of the tapered active region, respectively; and
an electron blocking layer with an average thickness between 10 nm and 50 nm, extending both at:
   a first interface between the p-doped layer and the substrate; and
   a second interface between the tapered active region and the p-doped layer.

19. The silicon photonics chip of claim 18, wherein the active region is tapered such that a lateral side of the tapered active region on which the electron blocking layer extends deviates from the stacking direction z by an angle α that is between 5° and 70°.

20. The silicon photonics chip of claim 19, wherein the angle α is between 10° and 30°.

* * * * *